United States Patent
Park et al.

(10) Patent No.: US 7,553,758 B2
(45) Date of Patent: Jun. 30, 2009

(54) METHOD OF FABRICATING INTERCONNECTIONS OF MICROELECTRONIC DEVICE USING DUAL DAMASCENE PROCESS

(75) Inventors: Wan-jae Park, Seoul (KR);
Hyung-yoon Choi, Gyeonggi-do (KR);
Yi-hsiung Lin, Taipei (TW); Tong Qing Chen, Singapore (CN)

(73) Assignees: Samsung Electronics Co., Ltd. (KR);
Chartered Semiconductor Manufacturing Ltd., Singapore (SG);
International Business Machines Corporation, Armonk, NY (US)

( * ) Notice: Subject to any disclaimer, the term of this patent is extended or adjusted under 35 U.S.C. 154(b) by 208 days.

(21) Appl. No.: 11/532,719

(22) Filed: Sep. 18, 2006

(65) Prior Publication Data

US 2008/0070409 A1 Mar. 20, 2008

(51) Int. Cl.
*H01L 21/4763* (2006.01)

(52) U.S. Cl. ............... 438/634; 438/638; 438/924; 257/E21.579; 257/E21.497

(58) Field of Classification Search .......... 438/675, 438/634, 638, 702, 924; 257/E21.579, E21.24, 257/E21.247, E21.497
See application file for complete search history.

(56) References Cited

U.S. PATENT DOCUMENTS

| | | | |
|---|---|---|---|
| 6,518,166 B1 | 2/2003 | Chen et al. | |
| 6,649,515 B2 * | 11/2003 | Moon et al. | 438/637 |
| 7,172,959 B2 * | 2/2007 | Lee | 438/622 |
| 2003/0224595 A1 * | 12/2003 | Smith et al. | 438/637 |
| 2004/0140289 A1 * | 7/2004 | Su et al. | 216/58 |
| 2004/0185655 A1 * | 9/2004 | Jiang et al. | 438/636 |

FOREIGN PATENT DOCUMENTS

| | | |
|---|---|---|
| JP | 2004-221104 | 8/2004 |
| KR | 10-0430472 | 4/2004 |

* cited by examiner

*Primary Examiner*—Caridad M Everhart
(74) *Attorney, Agent, or Firm*—Myers Bigel Sibley & Sajovec

(57) ABSTRACT

Method of Fabricating Interconnections of a Microelectronic Device Using a Dual Damascene Process. A method of fabricating interconnections of a microelectronic device includes preparing a semiconductor substrate comprising a lower dielectric layer and a lower interconnection, forming an etch stopper layer and an interlayer dielectric layer on the semiconductor substrate, forming a via hole in the interlayer dielectric layer so that the etch stopper layer is exposed through the via hole, performing carbon doping on the etch stopper layer, performing trench etching to form a trench in the interlayer dielectric layer so that the trench overlaps part of the via hole, removing the carbon-doped etch stopper layer, and filling the via hole and the trench with a conductive material to form an upper interconnection.

17 Claims, 10 Drawing Sheets

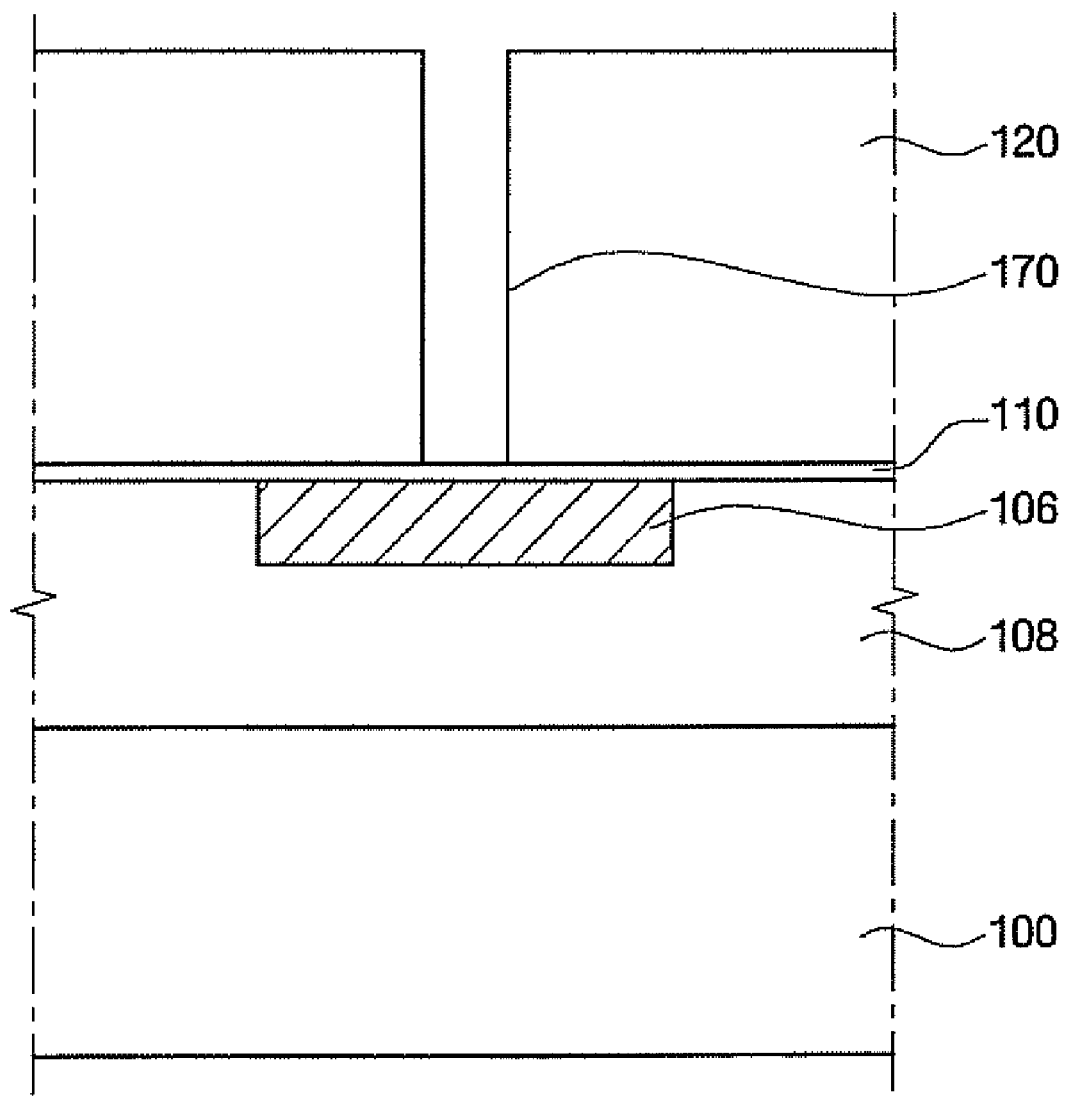

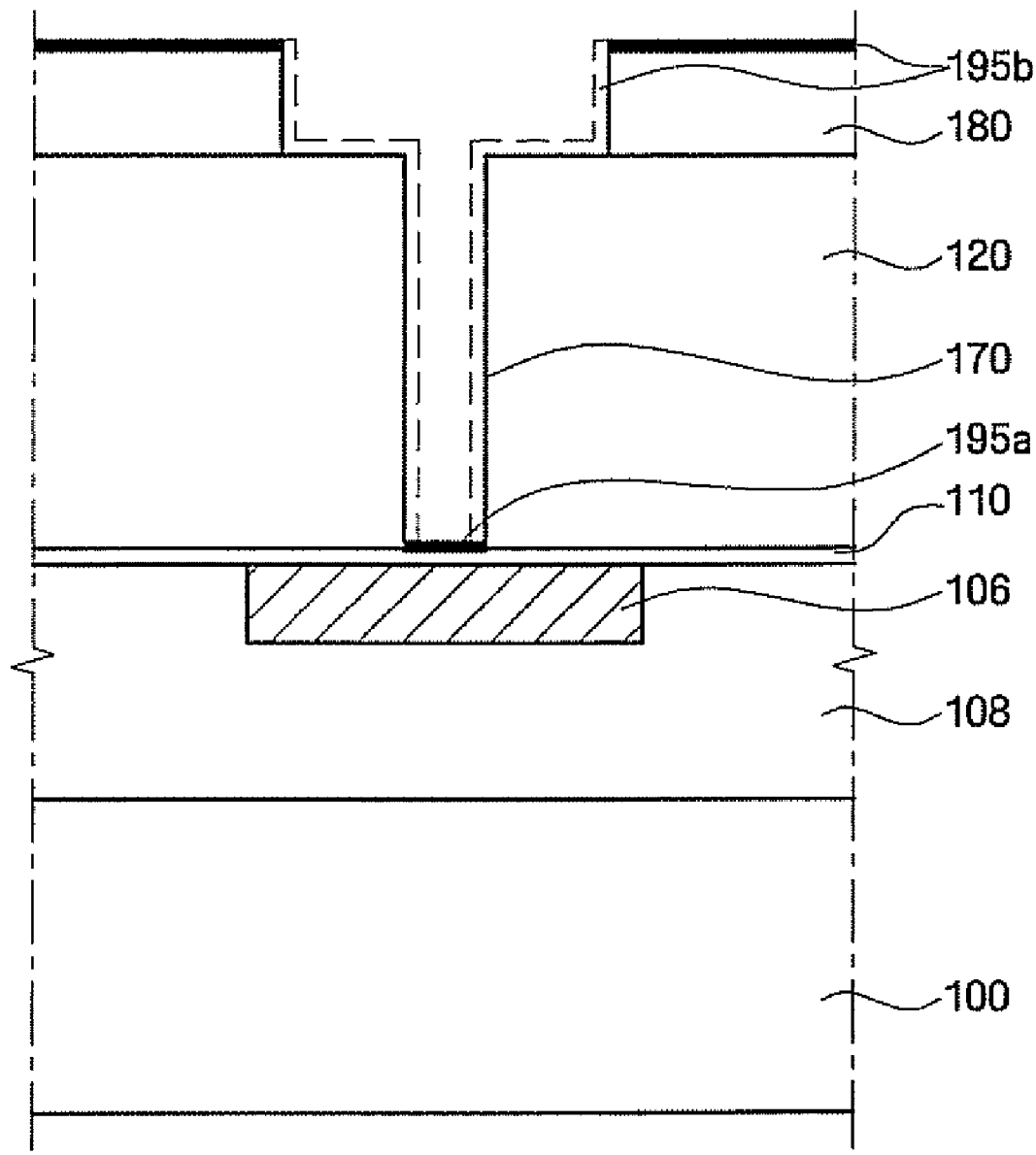

METHOD OF FABRICATING INTERCONNECTIONS OF MICROELECTRONIC DEVICE USING DUAL DAMASCENE PROCESS

BACKGROUND OF THE INVENTION

1. Field of the Invention

The present invention relates to a microelectronic device, and, more particularly, to a method of fabricating interconnections of a microelectronic device using a dual damascene process.

2. Description of the Related Art

In general, metal interconnections are used to connect a microelectronic device to another device and connect an interconnection to another interconnection.

Aluminum or tungsten is widely used as the material of metal interconnections, but, due to a low melting point and a high resistivity, is no longer suitable for highly integrated semiconductor devices. As the integration density of microelectronic devices, for example, semiconductor devices, increases, the demand for a material which has a low resistivity and is highly reliable in terms of electromigration and stress migration has steadily grown, and recently more attention has been paid to copper as a suitable material for metal interconnections of highly integrated semiconductor devices.

Copper is deemed suitable for metal interconnections because it has a relatively high melting point of approximately 1080° C. (aluminum: 660° C., tungsten: 3400° C.) and a relatively low resistivity of 1.7 μΩcm (aluminum: 2.7 μΩcm, tungsten: 5.6 μΩcm).

A copper interconnection fabrication method involves a complicated and difficult etching operation and may suffer from erosion diffusion. Thus, it is difficult to put a copper interconnection fabrication method to practical use.

In order to address these problems, a single damascene process and a dual damascene process have been used. In a damascene process, a trench or a via is formed by patterning a dielectric layer using photolithography, the trench or the via is filled with a conductive material such as tungsten, aluminum, or copper, and an excessive conductive material is removed using etch-back or chemical vapor deposition (CVD), thereby forming an interconnection that conforms the shape of the trench or the via.

However, as the design rule of the interconnection becomes more constrained, during a dual damascene process, the filling margin of a conductive material unavoidably increases. Accordingly, there is a need for a reliable dual damascene process capable of fabricating a flawless dual damascene interconnection by increasing the filling margin of a conductive material.

SUMMARY OF THE INVENTION

The present invention provides a method of fabricating interconnections of a microelectronic device using a dual damascene process.

According to an aspect of the present invention, there is provided a method of fabricating interconnections of a microelectronic device including preparing a semiconductor substrate comprising a lower dielectric layer and a lower interconnection, forming an etch stopper layer and an interlayer dielectric layer on the semiconductor substrate, forming a via hole in the interlayer dielectric layer so that the etch stopper layer is exposed through the via hole, performing carbon doping on the etch stopper layer, performing trench etching to form a trench in the interlayer dielectric layer so that the trench overlaps part of the via hole, removing the carbon-doped etch stopper layer, and filling the via hole and the trench with a conductive material to form an upper interconnection.

According to another aspect of the present invention, there is provided a method of fabricating interconnections of a semiconductor integrated circuit device including preparing a semiconductor substrate comprising a lower dielectric layer and lower interconnection, forming an etch stopper layer and an interlayer dielectric layer on the semiconductor substrate, forming a via hole in the interlayer dielectric layer so that the etch stopper layer is exposed through the via hole, implanting carbon ions into the etch stopper layer exposed by the via hole, performing trench etching to form a trench in the interlayer dielectric layer so that the trench overlaps part of the via hole, removing the carbon-ion-implanted etch stopper layer, and filling the via hole and the trench with a conductive material to form an upper interconnection.

According to still another aspect of the present invention, there is provided a method of interconnections of a microelectronic device including preparing a semiconductor substrate comprising a lower dielectric layer and a lower interconnection, forming an etch stopper layer and an interlayer dielectric layer on the semiconductor substrate, forming a via hole in the interlayer dielectric layer so that the etch stopper layer is exposed through the via hole, forming a polymer containing fluoride and carbon on the etch stopper layer, performing trench etching so that the trench overlaps part of the via hole to form a trench in the interlayer dielectric layer, removing the polymer and the etch stopper layer, and filling the via hole and the trench with a conductive material to form an upper interconnection.

BRIEF DESCRIPTION OF THE DRAWINGS

The above and other features and advantages of the present invention will become more apparent by describing in detail preferred embodiments thereof with reference to the attached drawings in which:

FIGS. 2A through 2H are cross-sectional views illustrating a method of fabricating interconnections of a microelectronic device using a dual damascene process according to an exemplary embodiment of the present invention; and FIG. 3 is a cross-sectional view illustrating a method of fabricating interconnections of a microelectronic device using a dual damascene process according to another exemplary embodiment of the present invention.

DETAILED DESCRIPTION OF THE INVENTION

Figure 1:
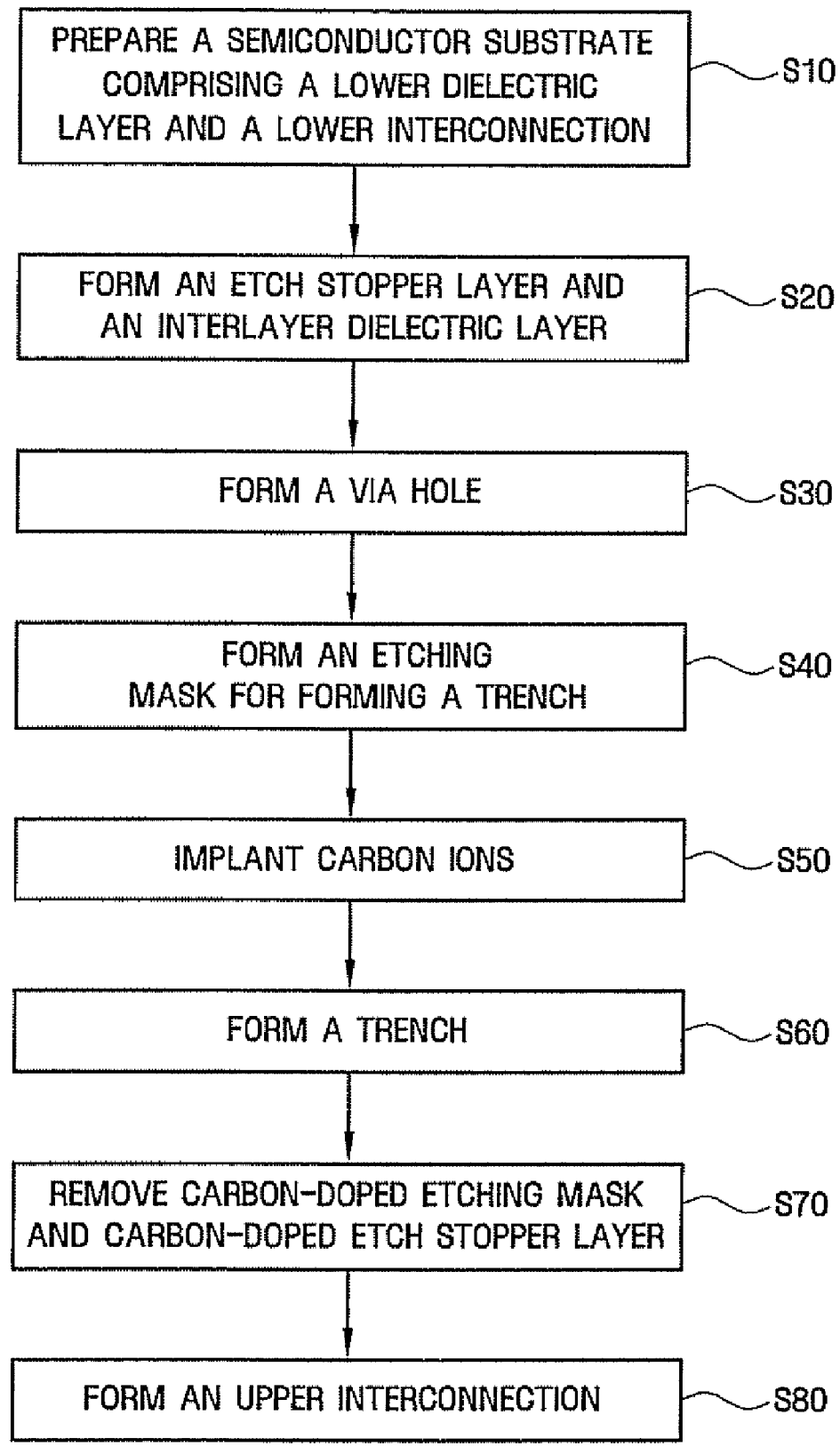
FIG. 1 is a flowchart illustrating a dual damascene interconnection fabrication method according to an exemplary embodiment of the present invention.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

A method of fabricating a dual damascene interconnection according to the present invention may be used to fabricate microelectronic devices such as high-density integrated circuit (IC) semiconductor devices, processors, micro-electro-mechanical devices (MEM's), optoelectronic devices, and display devices. In particular, the present invention is more useful for a central processing unit (CPU), a digital signal processor (DSP), a combination of the CPU and the DSP, an application specific IC (ASIC), a logic device, static random access memory (SRAM), and others that require high speed property.

A region where interconnections extending along a horizontal direction on a substrate are formed will now be referred to as a trench, and a contact that electrically connects an upper interconnection and a lower interconnection or electrically connects an upper interconnection and a semiconductor substrate will now be referred to as a via.

A method of fabricating interconnections using a dual damascene process according to an exemplary embodiment of the present invention will now be described in detail with reference to the accompanying drawings. In the following description, well-known processing steps are generally not described in detail in order to avoid unnecessarily obscuring the description of the present invention.

FIG. 1 is a flowchart illustrating a dual damascene interconnection fabrication method according to an exemplary embodiment of the present invention, and FIGS. 2A through 2H are cross-sectional views illustrating a method of fabricating interconnections of a microelectronic device using a dual damascene process according to an exemplary embodiment of the present invention.

Figure 2A:
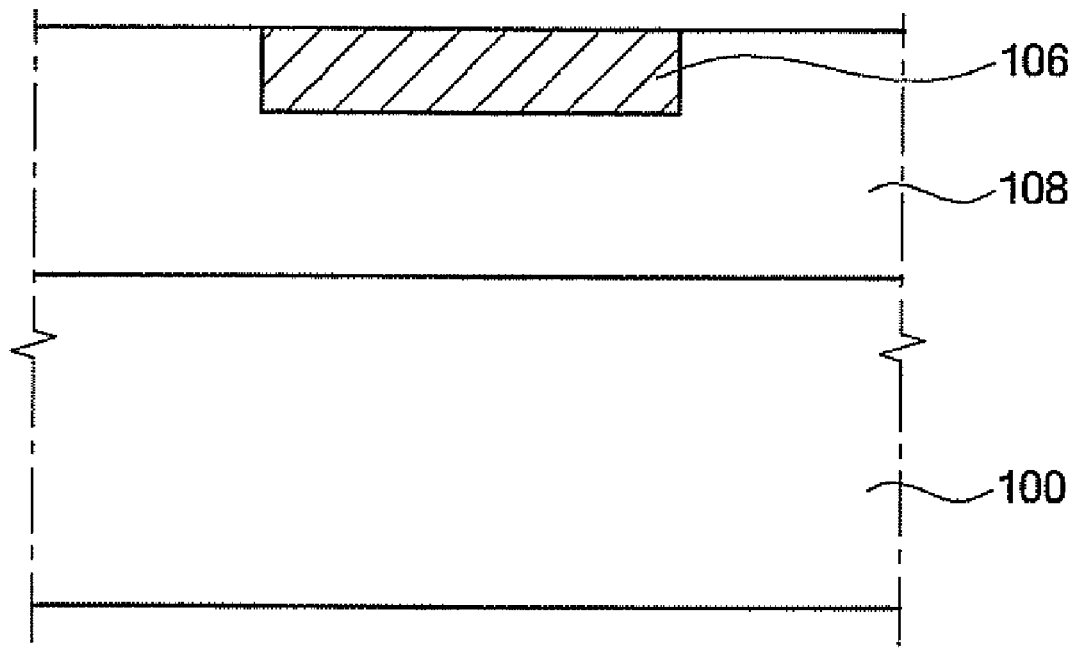

Referring to FIGS. 1 and 2A, in operation S10, a substrate 100 to which a dual damascene interconnection fabrication method will be applied is prepared.

A lower interlayer dielectric layer 108 including a lower interconnection 106 may be formed on the substrate 100. The substrate 100 may be a silicon substrate, a silicon-on-insulator (SOI) substrate, a gallium arsenic substrate, a silicon germanium substrate, a ceramic substrate, a quartz substrate, or a glass substrate for display. The substrate 100 may have diverse active devices and passive devices thereon. The lower interconnection 106 may be formed using one of diverse interconnection materials, e.g., copper, copper alloys, aluminum, aluminum alloys, tungsten, tungsten alloys, and so on. In terms of low resistivity, it is preferable to form the lower interconnection 106 using copper. Also, it is preferable that a surface of the lower interconnection 106 be planarized.

Figure 2B:
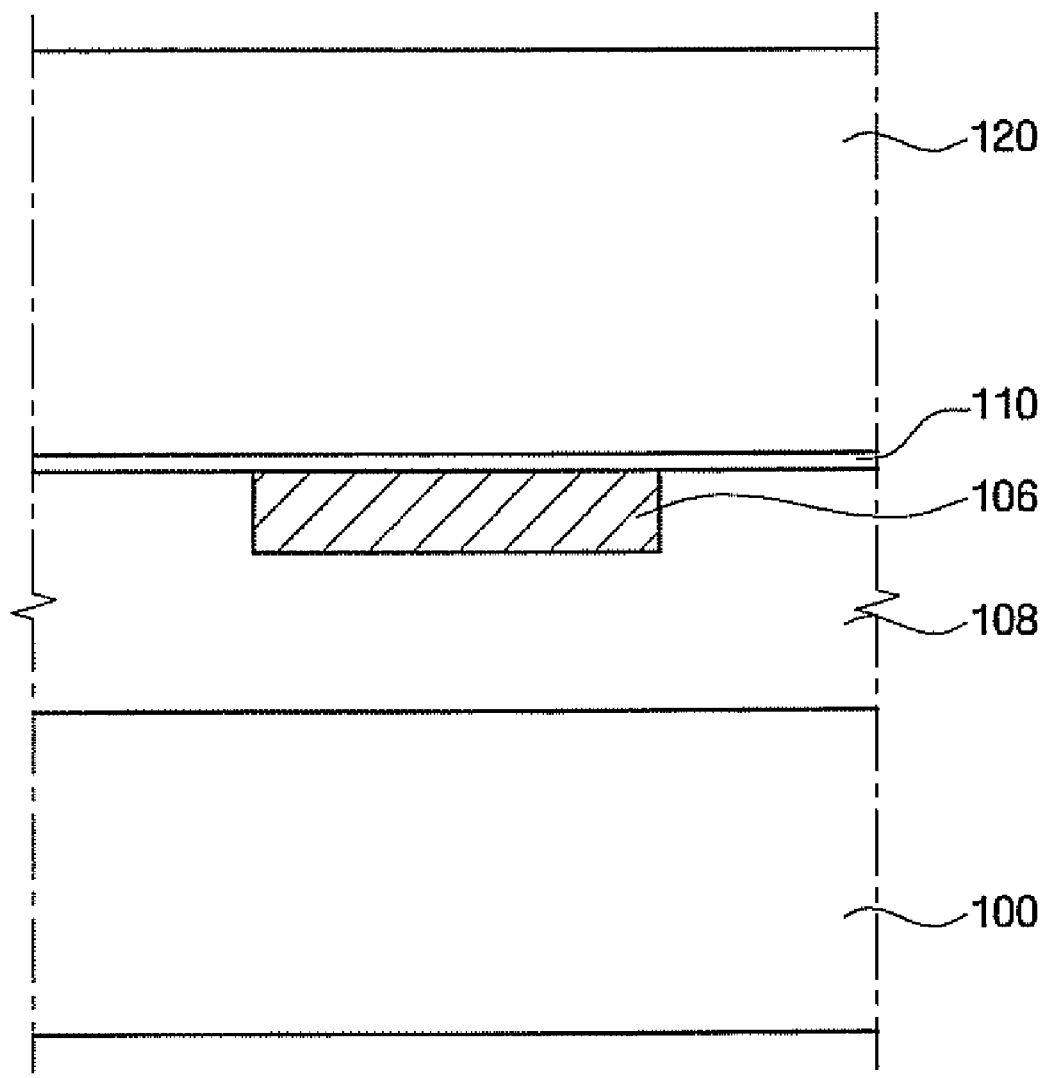

Referring to FIGS. 1 and 2B, in operation S20, an etch stopper layer 110 and an interlayer dielectric layer 120 are formed on the entire surface of the substrate 100 on which the lower interconnection 106 is formed.

The etch stopper layer 110 is formed of a material having high etching selectivity with respect to the interlayer dielectric layer 120. In an embodiment of the present invention, the etch stopper layer 110 may be formed of a material having a dielectric constant of 4-5 such as silicon carbide (SiC), silicon nitride (SiN), silicon carbonitride (SiCN), or any combination thereof. The thickness of the etch stopper layer 110 may be minimized in consideration of its influence on the dielectricity of the interlayer dielectric layer 120 to the extent that the etch stopper layer 110 can perform its functions properly.

The interlayer dielectric layer 120 may be formed of a low dielectric material so as to prevent RC signal delay, crosstalk, and an increase in power consumption. In an embodiment of the present invention, the interlayer dielectric layer 120 may be formed of a low dielectric material such as organosilicate glass (OSG) using chemical vapour deposition (CVD). The interlayer dielectric layer 120 may be formed to a thickness of 3,000-20,000 Å or to a thickness of 6,000-7,000 Å.

Referring to FIGS. 1 and 2C, a photoresist pattern (not shown) which defines a via hole 170 is formed on the interlayer dielectric layer 120. The photoresist pattern is formed by depositing photoresist which is suitable for a light source that emits light with a wavelength of 248 nm or less, exposing the photoresist using a photomask that defines the via hole 170, and developing the exposed photoresist. Thereafter, the via hole 170 is formed by etching the interlayer dielectric layer 120 using the photoresist pattern as an etching mask. Here, the etching of the interlayer dielectric layer 120 may be carried out using reactive ion etching (RIE) which involves the use of a mixture of a main etching gas such as $C_xF_y$ or $C_xH_yF_z$ and an inert gas such as Ar or a mixture of a main etching gas such as $C_xF_y$ or $C_xH_yF_z$, an inert gas such as Ar, and at least one gas selected from among oxygen, nitrogen, and $CO_x$ as an etching gas.

Thereafter, the photoresist pattern is removed by ashing using an oxygen-based plasma or a hydrogen-based plasma.

Figure 2D:
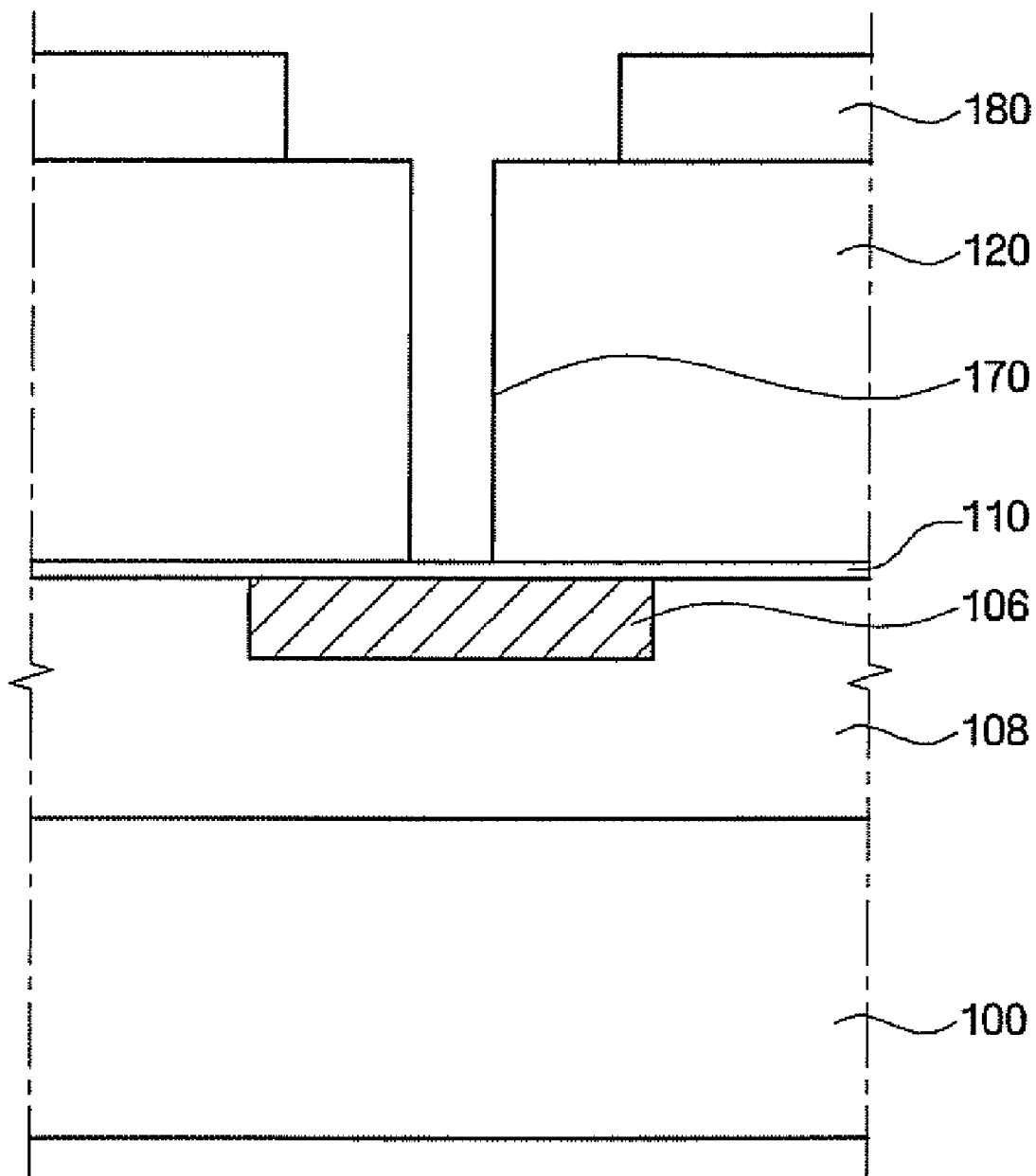

Referring to FIGS. 1 and 2D, in operation S40, an etching mask 180 for forming a trench is formed. The etching mask 180 may be a photoresist pattern which is formed by forming a photoresist layer, exposing the photoresist layer using a reticle (not shown) that defines a trench, and developing the exposed photoresist layer.

Figure 2E:
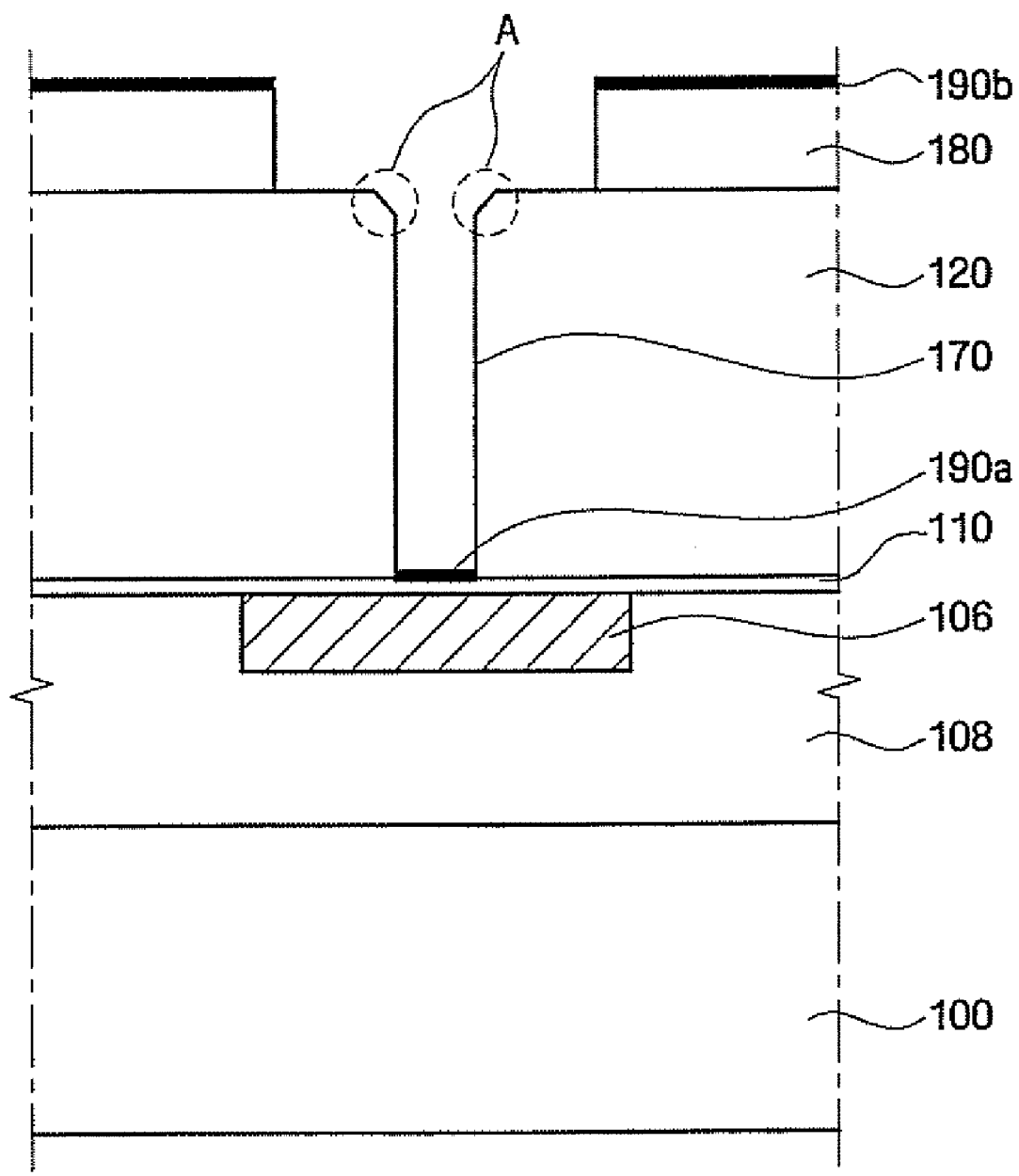

Referring to FIGS. 1 and 2E, in operation S50, carbon doping is performed on the etch stopper layer 110.

According to the current embodiment of the present invention, the carbon doping may be carried out by implanting carbon ions. In detail, the implantation of carbon ions may be carried out at a dosage of approximately $1e^{14}$-$1e^{15}$ ions/cm$^2$ with an energy level of approximately 1-30 keV.

As a result of the carbon ion implantation, a carbon-containing layer 190a may be formed on the etch stopper layer 110. The carbon-containing layer 190a may be comprised of a single layer consisting of a carbon-based etch stopper layer that contains more carbon atoms than the etch stopper layer 110 or a double layer consisting of the carbon-based etch stopper layer and a carbon layer. For example, the carbon-containing layer 190a may be a silicon carbonitride (SiCN) layer, a silicon carbide (SiC) layer, a double layer consisting of a silicon carbide (SiC) layer and a carbon layer, or a double layer consisting of a silicon carbide (SiC) layer and a carbon layer.

During the carbon ion implantation, the opening of the via hole 170 in the interlayer dielectric layer 120 may erode, thereby forming a slope as indicated by reference character A.

Since the etching selectivity between the carbon-containing layer 190a and the interlayer dielectric layer 120 is higher than the etching selectivity between the etch stopper layer 110 and the interlayer dielectric layer 120, it is not necessary to fill at least part of the via hole 170 with a sacrificial layer. Therefore, it is possible to address problems that may arise from the use of a sacrificial layer, such as non-uniformity in the depth and critical dimension between different trench patterns, complicate processes including the use of and etching of a hard mask, and a residue problem due to the use of the sacrificial layer, the residue being left behind in the via hole 170 even after the removal of the sacrificial layer.

While the carbon-containing layer 190a is formed on the etch stopper layer 110, a carbon-containing layer 190b may be formed on the etching mask 180 which is comprised of a photoresist pattern. The carbon-containing layer 190b can enhance the etching selectivity of the interlayer dielectric layer 120 in an etching operation for forming a trench, which will now be described in detail.

Figure 2F:
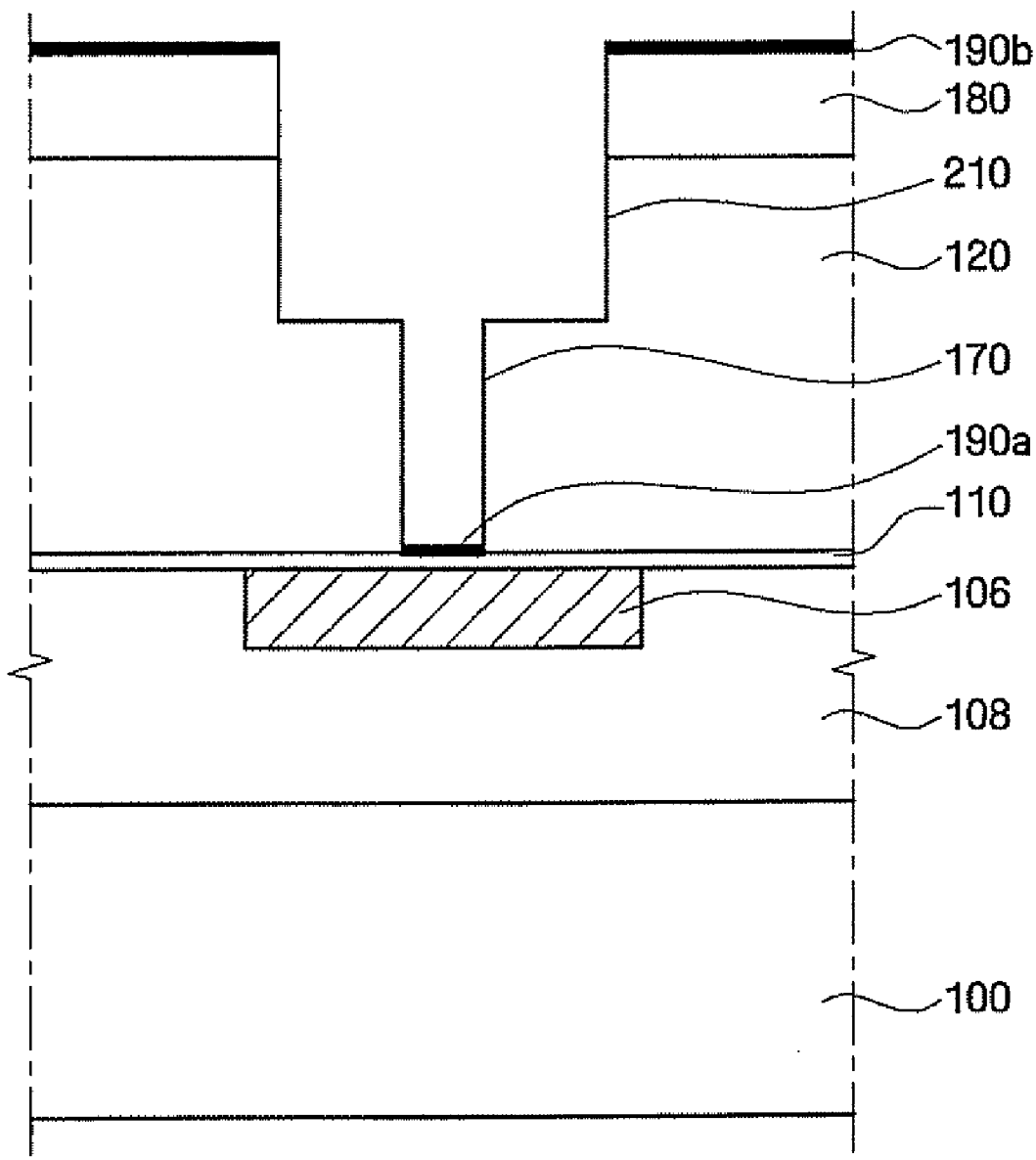

Referring to FIGS. 1 and 2F, in operation S60, a trench 210 is formed.

Trench etching is performed to form the trench 210 using, as an etching mask, the etching mask 180 on which the carbon-containing layer 190b is formed. The trench etching may be performed by RIE using a mixture of a main etching gas such as $C_xF_y$ or $C_xH_yF_z$ and an inert gas such as Ar or a mixture of a main etching gas such as $C_xF_y$ or $C_xH_yF_z$, an inert gas such as Ar, and at least one gas selected from among oxygen, nitrogen, and $CO_x$ as an etching gas. The trench etching may be carried out by fixing an etch termination time at a predefined time or by using an etch stopper layer (not shown).

In the current embodiment of the present invention, unlike in the prior art, the carbon-containing layer 190a on the etch stopper layer 110 is exposed to an etching gas used in the etching operation for forming the trench 210 because the via hole 170 is not filled with a sacrificial layer. Therefore, most of the sidewalls of the via hole 170 are exposed to the etching gas used in the etching for forming the trench 210.

Figure 2G:
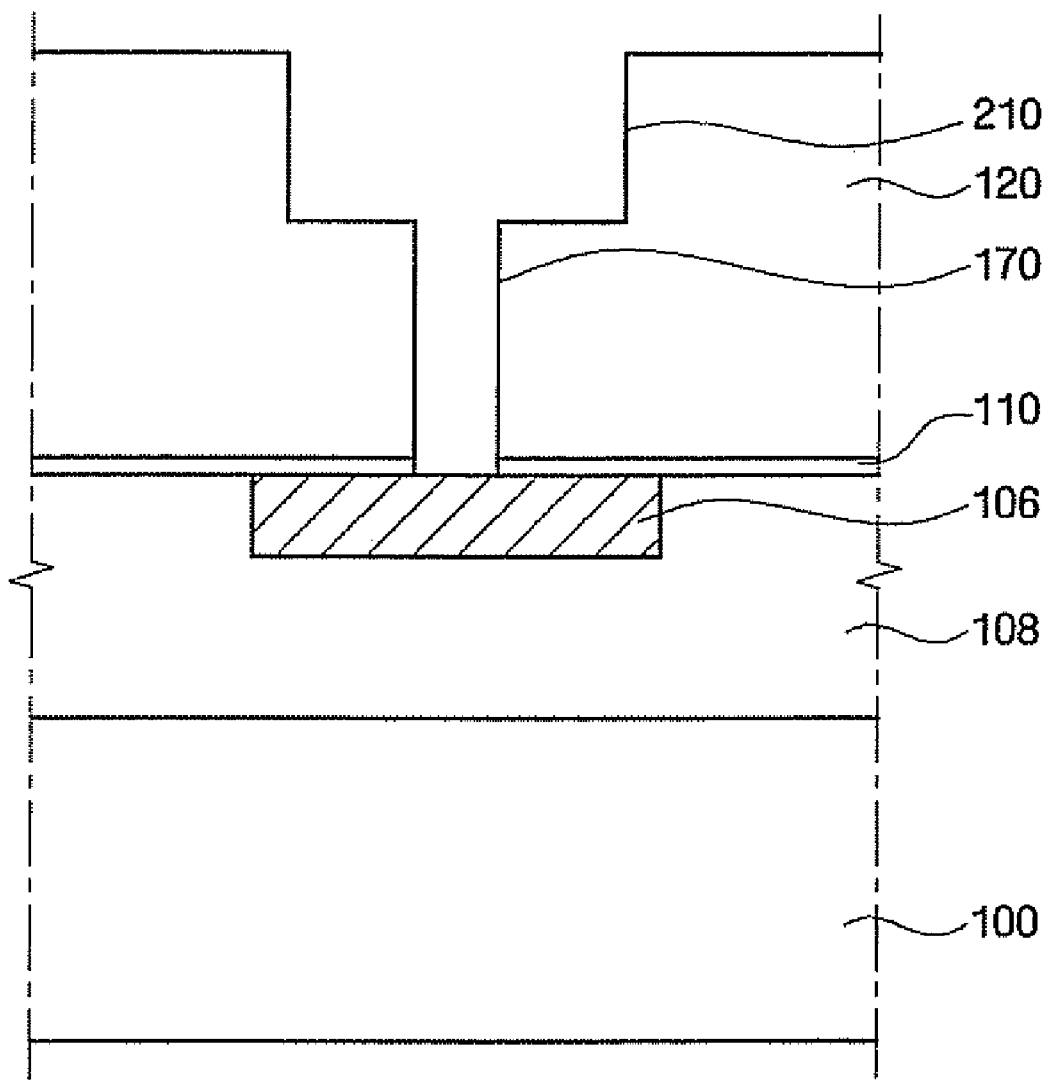

Referring to FIGS. 1 and 2G, in operation S70, the etching mask 180 and the etch stopper layer 110 are removed.

In detail, the etching mask 180 on which the carbon-containing layer 190b is formed may be removed by performing an $O_2$ ashing operation on the etching mask 180 or treating the etching mask 180 with a hydrogen ($H_2$)-based plasma, and performing a wet strip operation on the etching mask 180.

Thereafter, the lower interconnection 106 is exposed by removing the carbon-containing layer 190a and the etch stopper layer 110 which are exposed at the bottom of the via hole 170, thereby forming a dual damascene area consisting of a via 200 and the trench 210. The etching of the carbon-containing layer 190a and the etch stopper layer 110 may be conducted under such etching conditions that the carbon-containing layer 190a and the etch stopper layer 110 can be selectively removed without adversely affecting the lower interconnection 106.

In another illustrative embodiment of the present invention, the carbon-containing layer 190a and the etch stopper layer 110 may be simultaneously removed when removing the etching mask 180.

Figure 2H:
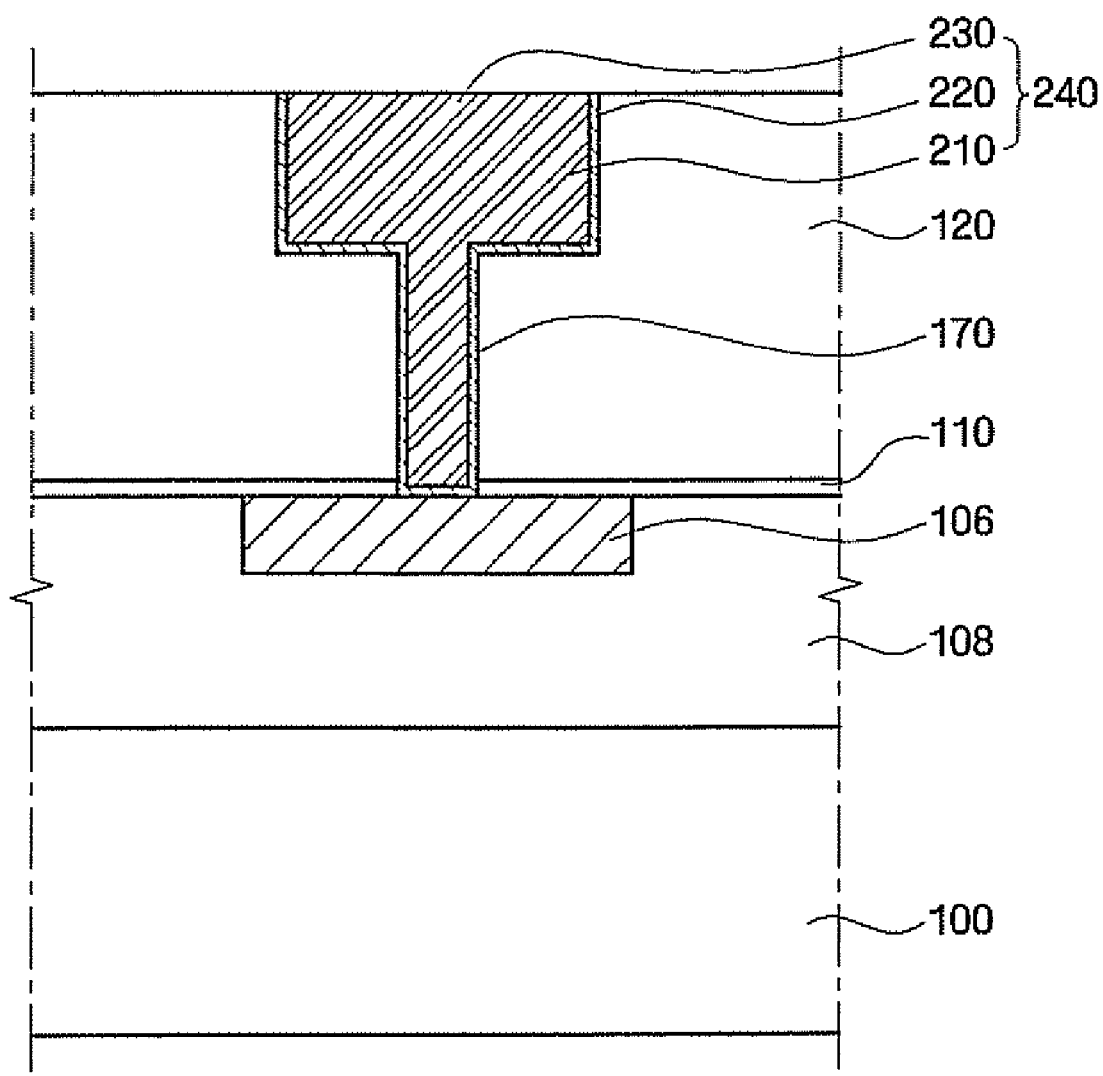

Referring to FIGS. 1 and 2H, in operation S80, an upper interconnection 240 is formed by filling the via hole 170 and the trench 210 with a conductive material.

A barrier metal layer 220 is formed in the dual damascene region consisting of the via hole 170 and the trench 210, and the dual damascene region is filled with an interconnection material 230, thereby completing dual damascene interconnection 240.

The barrier metal layer 220 may be formed using CVD, physical vapour deposition (PVD), or sputtering. The barrier metal layer 220 may be formed of a material which can prevent the interconnection material 230 from diffusing into the interlayer dielectric layer 120 and can effectively adhere to the interconnection material 230 and the interlayer dielectric layer 120. For example, the barrier metal layer 220 may be formed of titanium, titanium nitride, tantalum, or tantalum nitride. After the formation of the barrier metal layer 220, a seed layer is formed of a metal such as copper using PVD, and the trench 210 and the via 200 are filled with the interconnection material 230 using electroplating. Thereafter, the resulting substrate is planarized by removing an excessive barrier metal and interconnection material using chemical-mechanical polishing.

FIG. 3 is a cross-sectional view illustrating a method of fabricating interconnections of a microelectronic device using a dual damascene process according to another exemplary embodiment of the present invention.

Referring to FIG. 3, operations S10 through S40 in which a via hole 170 and a trench 210 are formed are the same as their respective counterparts described above with reference to FIGS. 1 and 2A through 2D, and thus, their detailed descriptions will be skipped.

In the current embodiment of the present invention, unlike in the previous embodiment of the present invention, carbon doping is performed using CVD. In other words, a carbon-containing layer 195a is formed on an etch stopper layer 110 by performing carbon doping using CVD. The carbon-containing process 195a may be comprised of a polymer containing carbon and fluoride.

For example, CVD is performed using a material having a carbon-to-fluoride ratio of 0.4 or higher, such as $C_4F_6$, $C_4F_8$, or $C_5F_8$, with a source power or a top power applied without a bias power. Then, the top surface of the etch stopper layer 110 is carbon-doped, thus forming a polymer 195a containing carbon and fluoride.

When carbon doping is performed using deposition, the carbon-containing layer 195b may be formed not only on the etch stopper layer 110 but also on an etching mask 180 for forming a trench. The carbon-containing layer 195b may also be formed on the sidewalls of the via hole 170 according to the conformality of a deposition process used to form the carbon-containing layer 195b, as indicated by a dotted line in FIG. 3.

Thereafter, operation S60 for forming a trench, operation S70 for removing a carbon-doped etching mask and a carbon-doped etch stopper layer, and operation S80 for forming an upper interconnection are the same as their respective counterparts described above with reference to FIGS. 1 and 2F through 2G, and thus, their detailed descriptions will be skipped.

As described above, according to the present invention, it is possible to enhance the etching selectivity of an interlayer dielectric layer in performing trench etching for forming a trench by carbon doping an etch stopper layer. Therefore, it is possible to effectively perform the etching for forming a trench without the need to fill at least part of a via hole with a sacrificial layer. In addition, according to the present invention, it is possible to address problems that may arise from the use of a sacrificial layer such as irregularities in the depths and critical dimensions of trenches between patterns and complicatedness of processes including the use and etching of a hard mask, and a high possibility of residues of the sacrificial layer being left behind in the via hole 170 even after the removal of the sacrificial layer. Therefore, it is possible to fabricate metal interconnections which have a low resistivity and can offer a high electromigration and stress migration speed.

Although the present invention has been described in connection with the exemplary embodiments of the present invention, it will be apparent to those skilled in the art that various modifications and changes may be made thereto without departing from the scope and spirit of the invention. Therefore, it should be understood that the above embodiments are not limitative, but illustrative in all aspects.

What is claimed is:

1. A method of fabricating interconnections of a microelectronic device, comprising:

preparing a semiconductor substrate comprising a lower dielectric layer and a lower interconnection;

forming an etch stopper layer and an interlayer dielectric layer on the semiconductor substrate;

forming a via hole in the interlayer dielectric layer so that the etch stopper layer is exposed through the via hole; then performing carbon doping on the etch stopper layer using an ion implantation process; then performing trench etching to form a trench in the interlayer dielectric layer so that the trench overlaps part of the via hole;

removing the carbon-doped etch stopper layer; and filling the via hole and the trench with a conductive material to form an upper interconnection.

2. The method of claim 1, wherein the performing of the trench etching comprises exposing the carbon-doped etch stopper layer to a trench etching gas.

3. The method of claim 1, wherein the ion implantation process is performed at a carbon dosage of approximately $1\times10^{14}$ ions/cm$^2$ to $1\times10^{15}$ ions/cm$^2$.

4. The method of claim 1, further comprising, before the performing of the carbon doping, forming an etching mask for forming a trench on the interlayer dielectric layer, wherein during the performing of the carbon doping, the etching mask is also carbon-doped, and the carbon-doped etching mask is removed before or during the removal of the carbon-doped etch stopper layer.

5. The method of claim 1, wherein the performing of the carbon doping comprises forming a carbon-containing layer on the etch stopper layer.

6. The method of claim 5, wherein the performing of the trench etching comprises exposing the carbon-containing layer to a trench etching gas.

7. The method of claim 5, wherein the carbon-containing layer is a single layer consisting of an etch stopper layer having more carbon atoms than the original etch stopper layer yet to be carbon-doped or a double layer consisting of the etch stopper layer having more carbon atoms than the original etch stopper layer yet to be carbon-doped and a carbon layer.

8. The method of claim 5, wherein the carbon-containing layer is a polymer containing carbon and fluoride.

9. A method of fabricating interconnections of a semiconductor integrated circuit device, comprising:

preparing a semiconductor substrate comprising a lower dielectric layer and lower interconnection;

forming an etch stopper layer and an interlayer dielectric layer on the semiconductor substrate;

forming a via hole in the interlayer dielectric layer so that the etch stopper layer is exposed through the via hole; then implanting carbon ions into the etch stopper layer exposed by the via hole; then performing trench etching to form a trench in the interlayer dielectric layer so that the trench overlaps part of the via hole;

removing the carbon-ion-implanted etch stopper layer; and filling the via hole and the trench with a conductive material to form an upper interconnection.

10. The method of claim 9, wherein implanting carbon ions is performed at a carbon dosage of approximately $1\times10^{14}$ ions/cm$^2$ to $1\times10^{15}$ ions/cm$^2$.

11. The method of claim 9 further comprising, before the implanting of carbon ions, forming an etching mask for forming a trench on the interlayer dielectric layer, wherein during the implanting of carbon ions, carbon ions are also implanted into the etching mask, and the carbon-ion-implanted etching mask is removed before or during the removal of the carbon-ion-implanted etch stopper layer.

12. The method of claim 9, wherein the implanting of the carbon ions comprises forming a carbon-containing layer on the etch stopper layer.

13. The method of claim 12, wherein the performing of the trench etching comprises exposing the carbon-containing layer to a trench etching gas.

14. The method of claim 12, wherein the carbon-containing layer is a single layer consisting of an etch stopper layer having more carbon atoms than the original etch stopper layer yet to be carbon-doped or a double layer consisting of the etch stopper layer having more carbon atoms than the original etch stopper layer yet to be carbon-doped and a carbon layer.

15. A method of fabricating a microelectronic device, comprising:

forming a lower dielectric layer having a lower electrical interconnect therein, on a semiconductor substrate;

forming an etch-stop layer on the lower electrical interconnect and the lower dielectric layer;

forming an interlayer dielectric layer on the etch-stop layer;

forming a via hole that extends through the interlayer dielectric layer and exposes an upper surface of the etch-stop layer; then implanting carbon ions through the via hole and into the exposed upper surface of the etch-stop layer to thereby increase a concentration of carbon in the exposed upper surface of the etch-stop layer; then selectively etching the interlayer dielectric layer to define a trench therein having a bottom through which the via hole extends; then removing the etch-stop layer to thereby expose the lower electrical interconnect.

16. The method of claim 15, wherein said implanting step comprises implanting carbon ions at a dose level in a range from $1\times10^{14}$ ions/cm$^2$ to $1\times10^{15}$ ions/cm$^2$.

17. The method of claim 15, wherein said implanting step is preceded by patterning an etching mask comprising a photoresist, on the interlayer dielectric layer; and wherein said implanting step comprises implanting carbon ions into the etching mask.

* * * * *